(12) United States Patent
Sutardja et al.

(10) Patent No.: US 8,779,961 B2
(45) Date of Patent: Jul. 15, 2014

(54) SCALABLE SUCCESSIVE-APPROXIMATION-REGISTER ANALOG-TO-DIGITAL CONVERTER

(71) Applicant: Marvell International Ltd., Hamilton (BM)

(72) Inventors: Sehat Sutardja, Los Altos Hills, CA (US); Giovanni Antonio Cesura, Cremona (IT); Francesco Rezzi, Cava Manara (IT); Rinaldo Castello, Arcore (IT)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 13/666,251

(22) Filed: Nov. 1, 2012

(65) Prior Publication Data
US 2013/0106638 A1 May 2, 2013

Related U.S. Application Data

(60) Provisional application No. 61/554,442, filed on Nov. 1, 2011.

(51) Int. Cl.
*H03M 1/20* (2006.01)
*H03M 1/12* (2006.01)
*H03M 1/00* (2006.01)

(52) U.S. Cl.
CPC .............. *H03M 1/20* (2013.01); *H03M 1/121* (2013.01); *H03M 1/002* (2013.01)
USPC ............................ 341/155; 341/141; 341/172

(58) Field of Classification Search
CPC ...... H03M 1/002; H03M 1/004; H03M 1/005
See application file for complete search history.

(56) References Cited

U.S. PATENT DOCUMENTS

| 4,679,028 | A  | * | 7/1987  | Wilson et al. ............... 341/120 |
| 6,993,291 | B2 | * | 1/2006  | Parssinen et al. .......... 455/67.11 |
| 2009/0201188 | A1 | * | 8/2009  | Boisvert ...................... 341/155 |
| 2010/0328123 | A1 | * | 12/2010 | Imai ............................. 341/141 |
| 2012/0307947 | A1 | * | 12/2012 | Kodama ....................... 375/344 |
| 2013/0016798 | A1 | * | 1/2013  | Velazquez et al. ........... 375/340 |

FOREIGN PATENT DOCUMENTS

WO    WO-2011/018711 A1    2/2011

OTHER PUBLICATIONS

Ginsburg, B et al. Highly Interleaved 5-bit, 250-MSample/s, 1.2-mW ADC With Redundant Channels in 65-nm CMOS, IEEE Journal of Solid-State Circuits, Vol. 43, No. 12, Dec. 2008, pp. 2641-2650.*
Staller/Cygnal Integrated Products Inc. Improving ADC Resolution by Oversampling and Averaging, application note AN018, May 2001.*
Reeder, Rob et al.; Pushing the State of the Art with Multichannel A/D Converters; May 2005; 4 pages.
Communication Relating to the Results of the Partial International Search for related PCT Application No. PCT/US2012/062990; Apr. 5, 2013; 8 pages.

* cited by examiner

*Primary Examiner* — Howard Williams (57) ABSTRACT

A system including a clock generator configured to generate a clock; a plurality of analog-to-digital converters each configured to convert a signal based on the clock, and to output a first number of bits in response to converting the signal based on the clock; and an averaging module configured to receive the first number of bits from each of the plurality of analog-to-digital converters, and to output a second number of bits. The second number of bits is greater than the first number of bits.

18 Claims, 9 Drawing Sheets

SCALABLE SUCCESSIVE-APPROXIMATION-REGISTER ANALOG-TO-DIGITAL CONVERTER

CROSS-REFERENCE TO RELATED APPLICATIONS

This application claims the benefit of U.S. Provisional Application No. 61/554,422, filed on Nov. 1, 2011. The disclosure of the above application is incorporated herein by reference in its entirety.

FIELD

The present disclosure relates to scalable successive-approximation-register (SAR) analog-to-digital converters (ADC's).

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Analog-to-digital converters (ADC's) convert analog signals into digital signals. A resolution of an ADC is typically measured in terms of a number of bits output by the ADC. Different applications require ADCs of different resolutions. As the resolution of an ADC increases, the size and power consumption of the ADC increases.

Several factors can cause errors in ADC's. For example, variations in processes used to manufacture components of an ADC can cause errors in the ADC. Most ADC's employ additional circuitry to correct the errors. The additional circuitry further increases the size and power consumption of the ADC's.

Most ADC's are designed for worst-case conditions (e.g., worst-case signal-to-noise ratios, worst-case process variations, and so on). Often the conditions may be better than worst-case conditions. The ADC's, however, cannot temporarily disable the additional circuitry that corrects errors in worst-case conditions. Accordingly, the additional circuitry continues to consume power.

Also, when conditions are better than the worst-case conditions, a lower resolution can provide acceptable results. ADC's designed for a particular resolution, however, cannot decrease the resolution when conditions are better than worst-case conditions, which leads to wasteful power consumption.

SUMMARY

A system comprising a clock generator configured to generate a clock; a plurality of analog-to-digital converters each configured to convert a signal based on the clock, and to output a first number of bits in response to converting the signal based on the clock; and an averaging module configured to receive the first number of bits from each of the plurality of analog-to-digital converters, and to output a second number of bits. The second number of bits is greater than the first number of bits.

In other features, the system further comprises a signal quality determination module configured to determine quality of the signal, where the quality of the signal includes one or more of (i) strength of the signal and (ii) signal-to-noise ratio of the signal. A power management module is configured to select, based on the quality of the signal, a number of analog-to-digital converters from the plurality of analog-to-digital converters, and to deactivate the selected number of analog-to-digital converters.

In other features, the system further comprises a quality of service determination module configured to determine a quality of service requirement of the system. A power management module is configured to select, based on the quality of service requirement of the system, a number of analog-to-digital converters from the plurality of analog-to-digital converters, and to deactivate the selected number of analog-to-digital converters.

In other features, the system further comprises a state detection module configured to detect when one of the plurality of analog-to-digital converters is in (i) a defective state or (ii) a metstable state. A disconnection module is configured to disconnect the detected one of the plurality of analog-to-digital converters from the averaging module.

In other features, the system further comprises an additional analog-to-digital converter configured to convert the signal based on the clock. The state detection module is configured to connect the additional analog-to-digital converter to the averaging module in response to disconnecting the detected one of the plurality of analog-to-digital converters from the averaging module.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

The present disclosure relates to a scalable ADC architecture that uses a medium-resolution ADC (e.g., a 10-bit or an 11-bit ADC) as a building block (hereinafter referred to as a baseline ADC) to build ADC's of different resolutions. Specifically, several baseline ADC's are connected in parallel. Each of the baseline ADC's converts an input signal using a clock signal and outputs N bits. For example, N=10 or 11 depending on whether the baseline ADC is a 10-bit or an 11-bit ADC. The outputs from the baseline ADC's are then averaged to cancel errors due to noise, process variations, and so on as explained below in detail.

One or more of the baseline ADC's can be turned on or off depending on signal quality (e.g., signal strength, signal-to-noise ratio, and so on). One or more additional baseline ADC's are provided as spares. When one or more of the baseline ADC's malfunction (e.g., operate in a metastable state), one or more of the spare baseline ADC(s) replace the malfunctioning baseline ADC(s). The malfunctioning baseline ADC(s) can be turned off. These and additional features are described below in detail.

Figure 1:
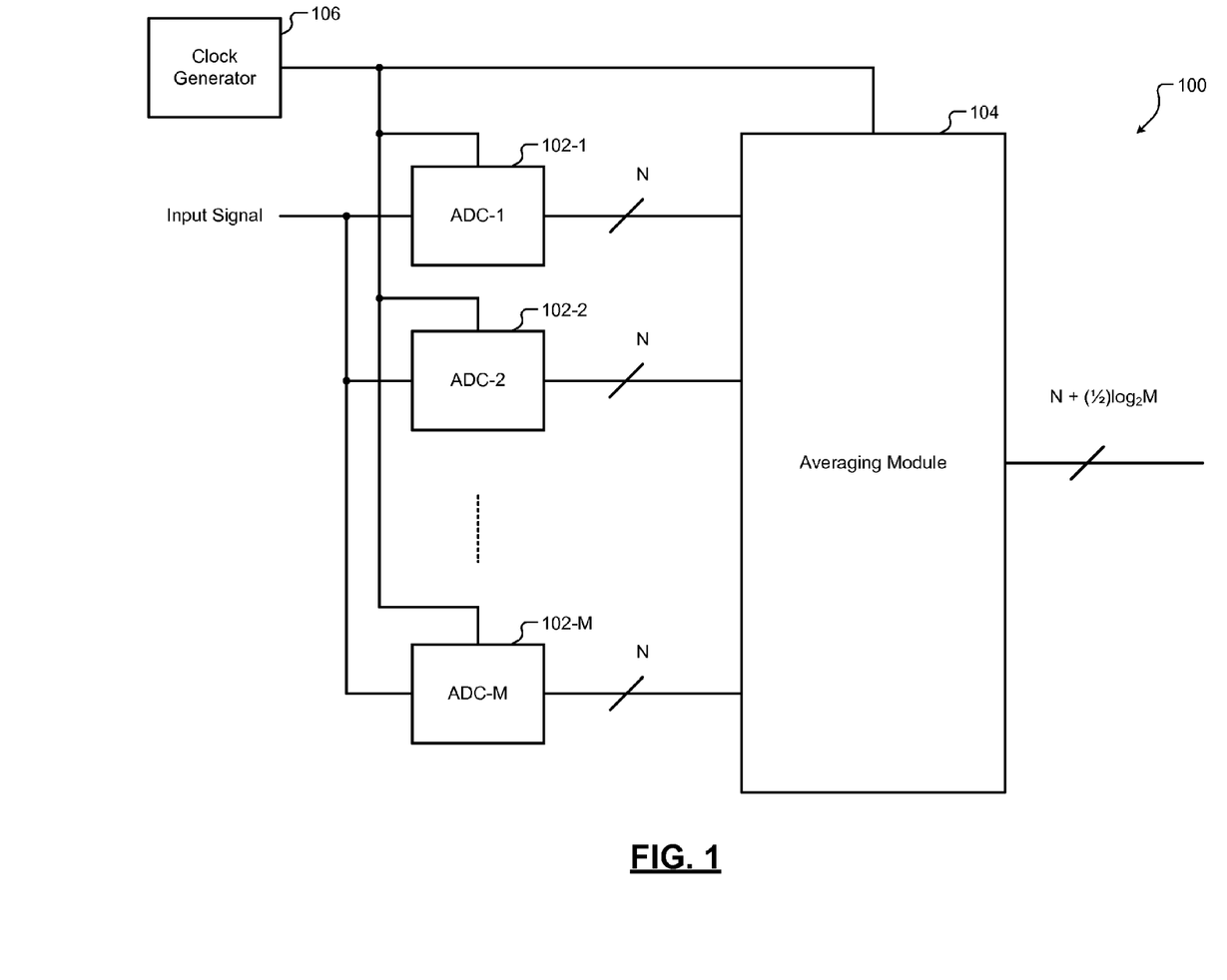
FIG. 1 is a functional block diagram of an analog-to-digital converter (ADC) including a plurality of baseline ADC's arranged in parallel.

Referring now to FIG. 1, an ADC 100 includes a plurality of baseline ADC's 102-1, 102-2, . . . , and 102-M (collectively, baseline ADC's 102), where M is an integer greater than 1; an averaging module 104, and a clock generator 106. Each of the baseline ADC's 102 receives an analog input signal and a clock signal generated by the clock generator 106. Each of the baseline ADC's 102 converts the analog input signal into N bits.

The averaging module 104 averages the N bits output by each of the baseline ADC's 102 using the clock signal. The averaging module 104 generates an output having a number of bits greater than N bits output by each of the baseline ADC's 102. The equivalent number of bits (ENOB) output by the averaging module 104 is a function of the number of the baseline ADC's 102 (M) and the number of bits output by each of the baseline ADC's 102 (N). The relationship between the ENOB, M, and N is given by the equation $ENOB=N+(\frac{1}{2})\log_2 M$. Accordingly, the ADC 100 has a greater resolution than each of the baseline ADC's 102. The averaging significantly reduces noise, offsets, and other non-idealities of the baseline ADC's 102.

Figure 2:
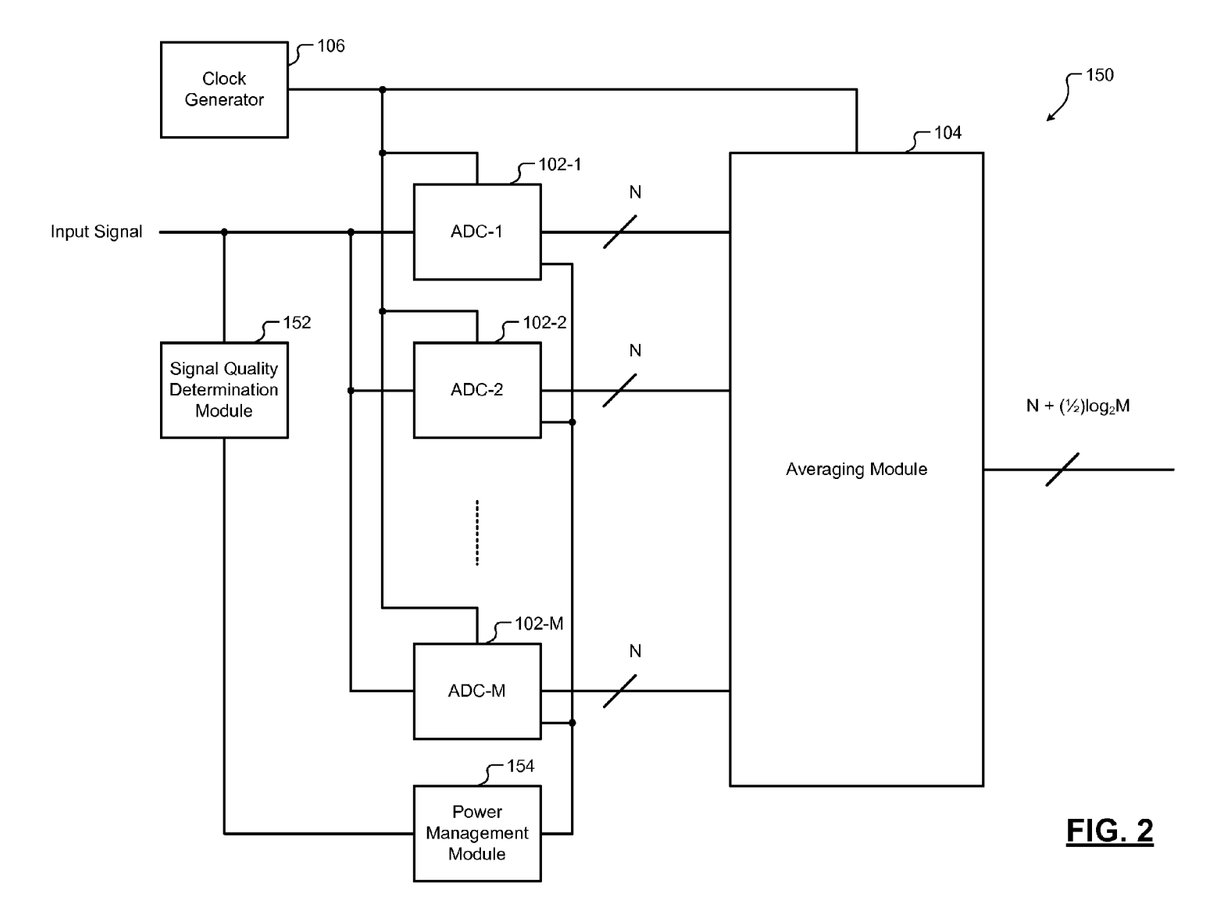
FIG. 2 is a functional block diagram of an ADC including a plurality of baseline ADC's arranged in parallel and a power management module to dynamically turn off one or more of the baseline ADC's based on signal quality.

Referring now to FIG. 2, an ADC 150 includes all the elements of the ADC 100 and additionally includes a signal quality determination module 152, and a power management module 154. The signal quality determination module 152 determines a signal quality of the input signal. For example, the signal quality determination module 152 determines signal strength and/or signal-to-noise ratio (SNR) of the input signal. The power management module 154 turns one or more of the baseline ADC's 102 on or off depending on the signal strength and/or SNR of the input signal.

For example, when the signal strength and/or SNR of the input signal increases to greater than or equal to a first threshold, the power management module 154 may turn off one of the baseline ADC's 102. As the signal quality improves further, and when the signal strength and/or SNR of the input signal increases to greater than or equal to a second threshold, the power management module 154 may turn off two of the baseline ADC's 102, and so on. For example, such a situation may occur when a client station including the ADC 150 moves closer to a base station.

Conversely, as the signal quality (i.e., the signal strength and/or the SNR) of the input signal decreases, the power management module 154 may turn on one or more of the baseline ADC's 102 that were turned off earlier. For example, such a situation may occur when a client station including the ADC 150 moves farther from a base station. Throughout the present disclosure, turning off a component means that a power supply and/or clock signal output to the component or a portion of the component is fully or partly turned off. In this manner, the power consumption of the ADC 150 can be dynamically adjusted based on the signal quality.

Figure 3:
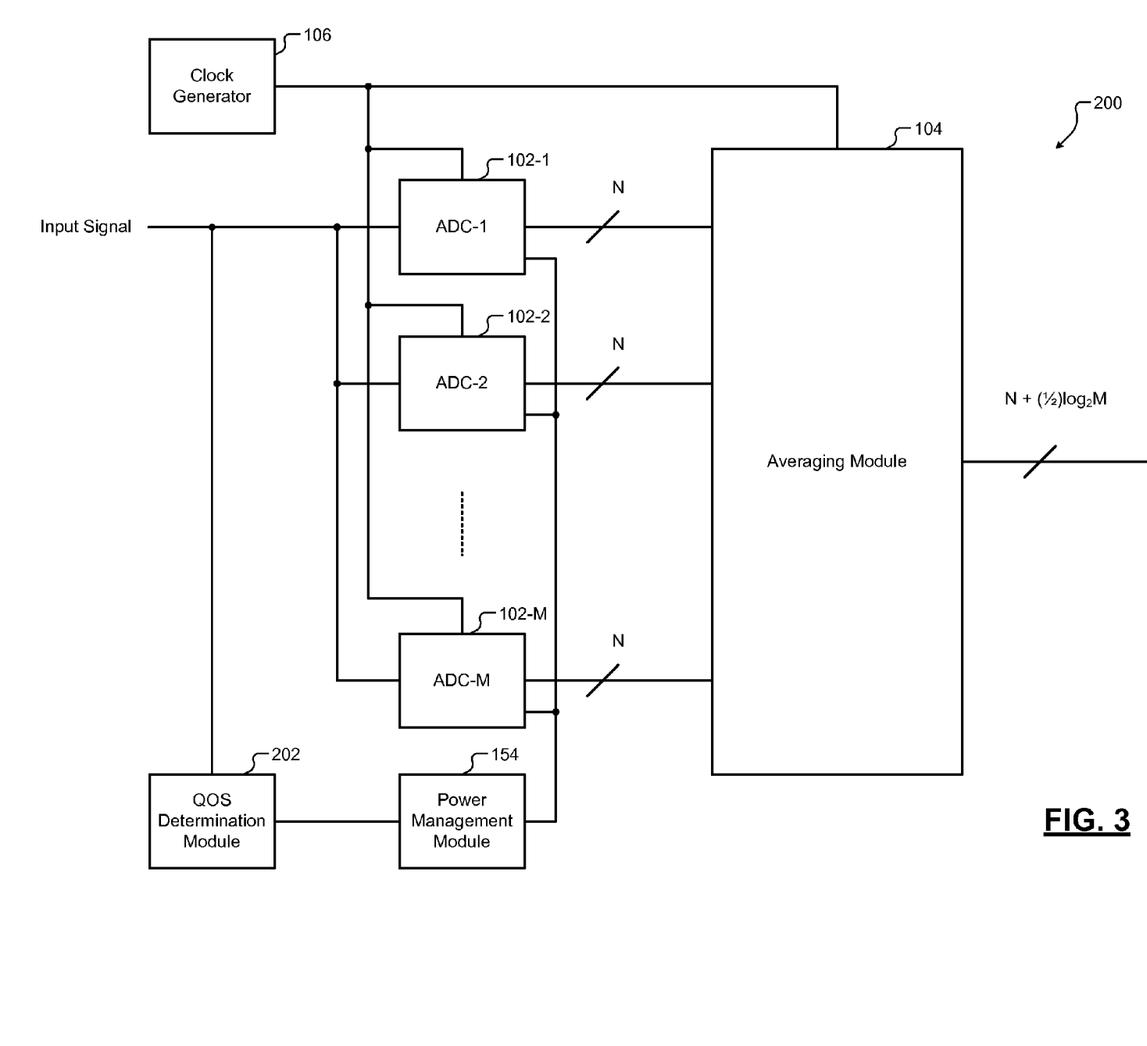
FIG. 3 is a functional block diagram of an ADC including a plurality of baseline ADC's arranged in parallel and a power management module to dynamically turn off one or more of the baseline ADC's based on quality of service.

Referring now to FIG. 3, an ADC 200 includes all the elements of the ADC 100 and additionally includes the power management module 154 and a quality of service (QOS) determination module 202. The QOS determination module 202 determines a QOS requirement of a device employing the ADC 200. The power management module 154 may turn on or off one or more of the baseline ADC's 102 based on the QOS requirement of the device employing the ADC 200. For example, the power management module 154 may turn on or off one or more of the baseline ADC's 102 depending on whether the QOS requirement is high or low.

The equivalent number of bits (ENOB) output by the averaging module 104 at a sampling time depends on the number of baseline ADC's on (i.e., active or in use by the averaging module 104) at the sampling time. For example, if L of the M baseline ADC's 102 are on at a sampling time T, where L is an integer less than or equal to M, the ENOB output by the averaging module 104 is given by the equation $ENOB=N+(\frac{1}{2})\log_2 L$.

Figure 4:
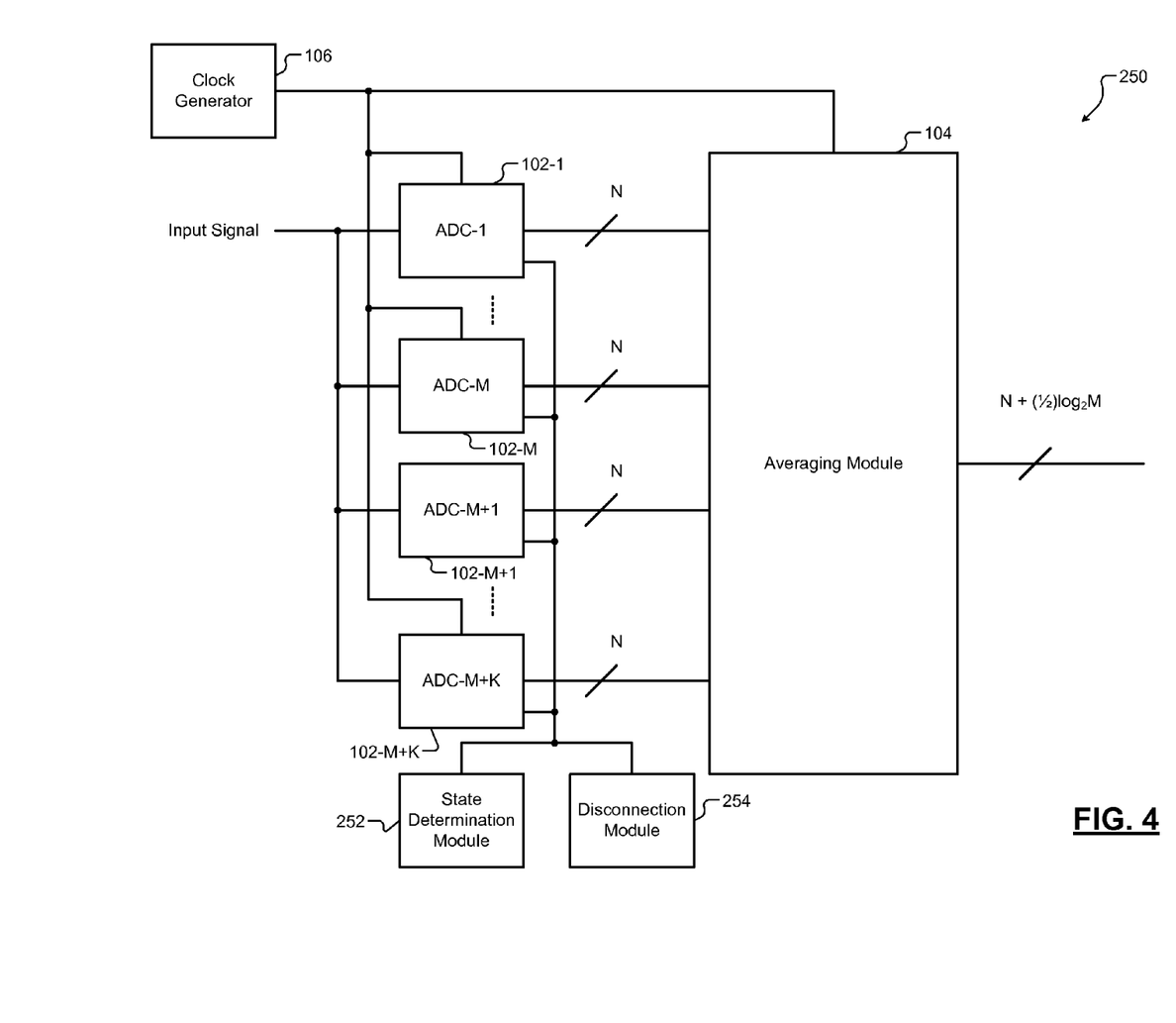
FIG. 4 is functional block diagram of an ADC including a plurality of baseline ADC's arranged in parallel and one or more spare baseline ADC's that can be used to dynamically replace one or more defective baseline ADC's.

Referring now to FIG. 4, an ADC 250 includes all the elements of the ADC 100 and additionally includes one or more spare baseline ADC's 102-M+1, 102-M+2, . . . , and 102-M+K (collectively spare baseline ADC's 102), where K is an integer greater than or equal to 1; a state determination module 252, and a disconnection module 254. The spare baseline ADC's 102 are identical to the baseline ADC's 102. For example, each of the spare baseline ADC's 102 receives the analog input signal and the clock signal generated by the clock generator 106. Each of the spare baseline ADC's 102 converts the analog input signal into N bits.

The state determination module 252 determines whether one or more of the baseline ADC's 102 is in a defective state or a metastable state. The disconnection module 254 disconnects one or more of the baseline ADC's 102 when the one or more of the baseline ADC's 102 is in a defective state or a metastable state. The disconnection module 254 may also turn off the one or more of the baseline ADC's 102 that are in a defective state or a metastable state. The averaging module 104 does not include the N bits output by the one or more of the baseline ADC's 102 that are in a defective state or a metastable state.

The state determination module 252 may determine if the number of remaining (i.e., normally operating or non-defective) baseline ADC's 102 is sufficient. For example, while not shown for simplicity of illustration, the ADC 250 may also include one or more of the signal quality determination module 152, the QOS determination module 202, and the power management module 154. Based on the signal quality and/or the QOS requirement of a device including the ADC 250, the state determination module 252 may determine if the number of remaining baseline ADC's 102 is sufficient. The state determination module 252 may not connect one or more of the spare baseline ADC's 102 to replace the one or more of the baseline ADC's 102 that are in a defective state or a metastable state if the number of remaining baseline ADC's 102 is sufficient. The state determination module 252 may connect one or more of the spare baseline ADC's 102 to replace the one or more of the baseline ADC's 102 that are in a defective state or a metastable state if the number of remaining baseline ADC's 102 are insufficient.

The equivalent number of bits (ENOB) output by the averaging module 104 at a sampling time depends on the number of baseline ADC's and the number of spare baseline ADC's 102 that are on (i.e., active or in use by the averaging module 104) at the sampling time. For example, if L of the (M+K) baseline and spare baseline ADC's 102 are on at a sampling time T, the ENOB output by the averaging module 104 is given by the equation $ENOB=N+(½)\log_2 L$.

In some implementations, one or more of the M baselines ADC's 102 may be designated and used as spare baseline ADC's. For example, K of the M baseline ADC's 102 may be designated for regular use, and (M−K) baseline ADC's 102 may be designated to be used as spare baseline ADC's 102, where K is an integer greater than or equal to 1. The equivalent number of bits (ENOB) output by the averaging module 104 is given by the equation $ENOB=N+(½)\log_2 K$.

Any ADC having thermal noise sufficient to toggle a least significant bit (LSB) output by the ADC can be used as baseline ADC. For low/medium resolution, a successive approximation register (SAR) ADC occupies a smaller die area than other ADC's and is therefore preferable. The thermal noise of each baseline ADC acts as a dither of the input signal. In the presence of thermal noise, quantization error of each baseline ADC can be treated as ergodic, zero mean, uniformly distributed noise that is neither correlated with the input signal nor self-correlated. The central limit theorem holds in this condition, and a variance of the mean (i.e., variance of the output of the averaging module 104) decreases with M. As the number of samples increases, the error decreases, and the SNR of the resulting ADC improves with M by 3 dB/octave. The baseline ADC's may also incorporate oversampling, which can increase the number of samples averaged and decrease the noise (i.e., increase SNR) at a 6 dB/octave rate.

Figure 5:
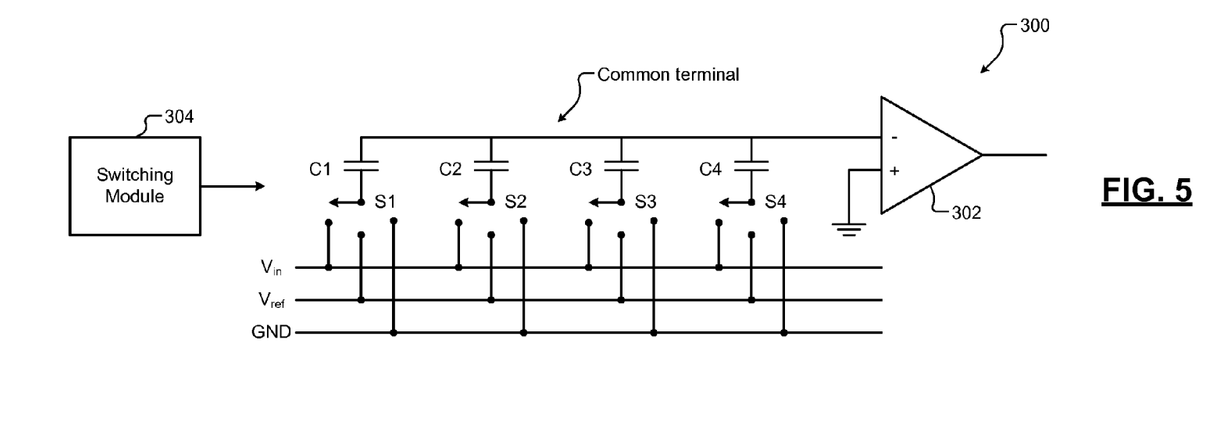
FIG. 5 is a schematic of a single-ended baseline ADC.

Referring now to FIG. 5, an example of a baseline ADC 102 is shown. The example shows a 2-bit successive approximation register (SAR) baseline ADC 300. The 2-bit SAR baseline ADC 300 includes four capacitors C1-C4, four switches S1-S4, a comparator 302, and a switching module 304. The capacitors C1-C4 are equal (i.e., C1=C2=C3=C4). The switching module 304 selectively connects the capacitors C1-C4 to an input signal ($V_{in}$), a reference voltage ($V_{ref}$), and ground (GND) using the switches S1-S4 and determines whether $V_{in}$ lies within one of four voltage ranges between $V_{ref}$ and GND as explained below.

Initially, the switching module 304 connects a common terminal of the capacitors C1-C4 to ground and connects free terminals of the capacitors C1-C4 to $V_{in}$. The switching module 304 then disconnects the common terminal of the capacitors C1-C4 from ground, disconnects the free terminals of the capacitors C1-C4 from $V_{in}$, and connects the free terminals of the capacitors C1-C4 to ground. Accordingly, the common terminal, which is connected to the negative terminal of the comparator 302, is at a potential ($-V_{in}$).

Subsequently, the switching module 304 connects capacitors C1 and C2 to $V_{ref}$. The potential at the common terminal is given by the equation $V_{common}=-V_{in}+(V_{ref})(C1+C2)/(C1+C2+C3+C4)$. Since C1=C2=C3=C4, $V_{common}=-V_{in}+(½)(V_{ref})$. The comparator 302 outputs a logic 1 if $V_{common}<0$ (i.e., $V_{in}>(½)(V_{ref})$). The comparator 302 outputs a logic 0 if $V_{common}>0$ (i.e., $V_{in}<(½)(V_{ref})$).

If $V_{in}<(½)(V_{ref})$, the switching module 304 connects capacitor C1 to $V_{ref}$. The potential at the common terminal is given by the equation $V_{common}=-V_{in}(V_{ref})(C1)/(C1+C2+C3+C4)$. Since C1=C2=C3=C4, $V_{common}=-V_{in}+(¼)(V_{ref})$. The comparator 302 outputs a logic 1 if $V_{common}<0$ (i.e., $V_{in}>(¼)(V_{ref})$). The comparator 302 outputs a logic 0 if $V_{common}>0$ (i.e., $V_{in}<(¼)(V_{ref})$).

Instead, if $V_{in}>(½)(V_{ref})$, the switching module 304 connects capacitors C1-C3 to $V_{ref}$. The potential at the common terminal is given by the equation $V_{common}=-V_{in}+(V_{ref})(C1+C2+C3)/(C1+C2+C3+C4)$. Since C1=C2=C3=C4, $V_{common}=-V_{in}+(¾)(V_{ref})$. The comparator 302 outputs a logic 1 if $V_{common}<0$ (i.e., $V_{in}>(¾)(V_{ref})$). The comparator 302 outputs a logic 0 if $V_{common}>0$ (i.e., $V_{in}<(¾)(V_{ref})$).

In this manner, the 2-bit SAR baseline ADC 300 determines whether $V_{in}$ lies within one of four voltage ranges: GND and $V_{ref}/4$, $V_{ref}/4$ and $V_{ref}/2$, $V_{ref}/2$ and $3V_{ref}/4$, or $3V_{ref}/4$ and $V_{ref}$. The four ranges are represented by two bits 00, 01, 10, and 11. A SAR baseline ADC similar to the 2-bit SAR baseline ADC 300 having a resolution greater than 2 bits can be designed using more than four capacitors and four switches.

In FIG. 5, ideally, the capacitors C1-C4 should be equal, and each of the capacitors C1-C4 should have a capacitance C. That is, ideally C1=C2=C3=C4=C. Practically, however, each of the capacitors C1-C4 may have a random error and therefore may have a capacitance different than C. For example, the capacitor C1 may have a random error $\Delta 1$, and therefore $C1=C\pm\Delta 1$; the capacitor C2 may have a random error $\Delta 2$, and therefore $C2=C\pm\Delta 2$; and so on.

Figure 6:
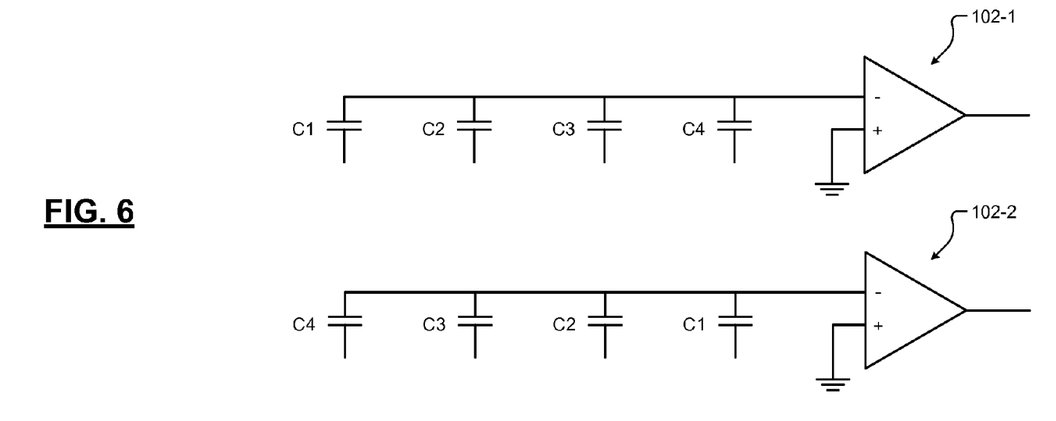
FIG. 6 is a schematic showing different capacitor assignments for different baseline ADC's arranged in parallel.

Referring now to FIG. 6, the random errors can be minimized by using many baseline ADC's in parallel (e.g., as shown in FIG. 1) and by changing capacitor assignments of the baseline ADC's. For example, in a first baseline ADC 102-1, the capacitor assignment may be C1, C2, C3, and C4 from left to right while in a second baseline ADC 102-2, the capacitor assignment may be C4, C3, C2, and C1 from left to right, and so on. The random errors are averaged and minimized when the averaging module 104 averages the outputs of the baseline ADC's.

Figure 7:
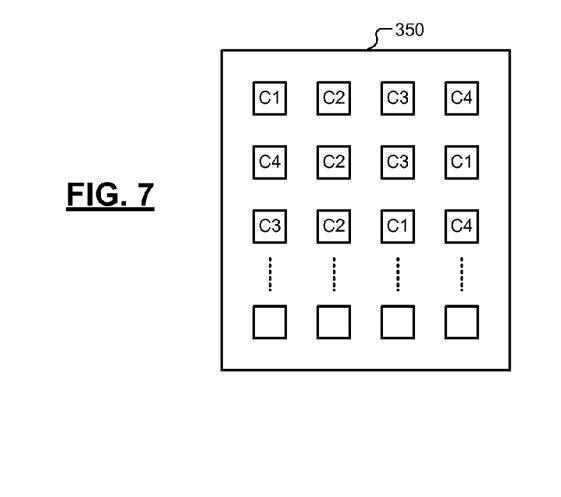
FIG. 7 depicts an arrangement of capacitors used by different baseline ADC's arranged in parallel.

Referring now to FIG. 7, the capacitors of the baseline ADC's 102 are typically manufactured in the form of an array of capacitors arranged on a die 350. The capacitors may have systematic errors due to process gradient, edge effects, and so on. The systematic errors may be greater than or equal to the random errors. For example, the capacitors adjacent to a boundary of the die 350 may have different capacitances than the capacitors towards the center of the die 350. If the process gradient is linear, the capacitance of the capacitors may increase or decrease linearly from one boundary of the die 350 to an opposite boundary of the die 350 (e.g., C1>C2>C3>C4 or C1<C2<C3<C4). If the process gradient is symmetrical, the capacitors adjacent to the boundaries of the die 350 may have different capacitances than the capacitors towards the center of the die 350. For example, capacitors C1 and C4, which are adjacent to the opposite boundaries of the die 350, may have different capacitance than capacitors C2 and C3, which are towards the center of the die 350.

The systematic errors can be minimized or eliminated by changing capacitor assignments of the baseline ADC's. Suppose the capacitors adjacent to a boundary of the die 350 have a systematic error $\Delta$sys. That is, suppose a left-most capacitor C1 in a first row of capacitors corresponding to a first baseline ADC has the systematic error $\Delta$sys. That is, C1=C+$\Delta$sys, and C2=C3=C4=C. The capacitor assignments for the baseline ADC's can be as follows.

In a first baseline ADC 102-1, the capacitor adjacent to the boundary of the die 350 is designated as the capacitor C1. That is, the capacitor C1 has the systematic error in the first baseline ADC (i.e., C1=C±$\Delta$sys, and C2=C3=C4=C). In a second baseline ADC 102-2, the capacitor adjacent to the boundary of the die 350 is designated as the capacitor C4. That is, the capacitor C4 has the systematic error in the second baseline ADC (i.e., C4=C±$\Delta$sys, and C1=C2=C3=C). In a third baseline ADC 102-3, the capacitor adjacent to the boundary of the die 350 is designated as the capacitor C3. That is, the capacitor C3 has the systematic error in the third baseline ADC (i.e., C3=C±$\Delta$sys, and C1=C2=C4=C), and so on. The systematic errors are averaged and minimized when the averaging module 104 averages the outputs of the baseline ADC's.

Figure 8A:
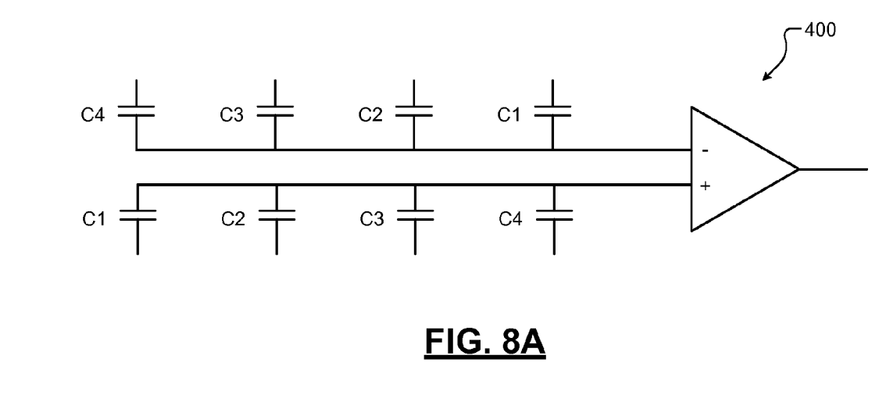
FIG. 8A is a schematic of a differential baseline ADC.
Figure 8B:
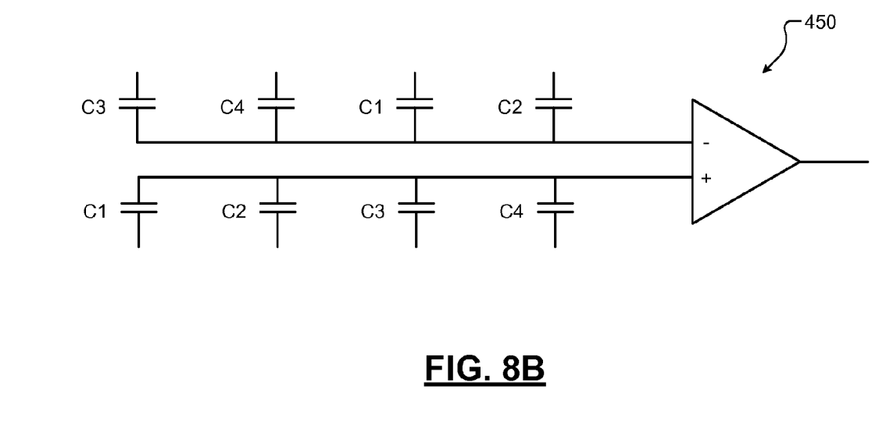
FIG. 8B is a schematic of a differential baseline ADC having different capacitor assignments for inverting and non-inverting inputs of a comparator.

Referring now to FIGS. 8A and 8B, a differential SAR ADC can be designed by arranging multiple differential SAR baseline ADC's in parallel and by averaging outputs of the multiple differential SAR baseline ADC's. In a differential SAR baseline ADC, a first set of capacitors is connected to a non-inverting input of the comparator while a second set of capacitors is connected to an inverting input of the comparator.

In FIG. 8A, an example of a baseline ADC 102 is shown. The example shows a differential 2-bit SAR baseline ADC 400. The capacitors in the first set are assigned an order C1-C4 from left to right while the capacitors in the second set are assigned an order C4-C1 from left to right. The capacitor assignment shown minimizes systematic errors when the process gradient is linear.

In FIG. 8B, another example of a differential baseline ADC is shown. The example shows a differential 2-bit SAR baseline ADC 450. The capacitors in the first set are assigned an order C1-C4 from left to right while the capacitors in the second set are assigned an order, for example, C3, C4, C1, and C2 from left to right. Alternatively, the capacitors in the second set can be assigned an order, for example, C3, C1, C4, and C2; or C2, C4, C1, C3; or C2, C1, C4, C3; and so on, from left to right. The capacitor assignment shown minimizes systematic errors when the process gradient is symmetrical.

Throughout the present disclosure, 2-bit baseline ADC's with four capacitors are shown for example only. Higher resolution baseline ADC's (e.g., 10-bit or 11-bit baseline ADC's) with greater than four capacitors may be used instead. Accordingly, the die 350, while shown as comprising four capacitors in each row, may comprise greater than four capacitors in each row depending on the resolution of the baseline ADC's.

The assignment of the capacitors can be determined in many ways. For example, connections between the capacitors in the die 350 and the baseline ADC's 102 can be hardwired according to the capacitor assignments of the respective baseline ADC's 102. Alternatively, the switching module 304 of each baseline ADC 102 may control the switches of the respective baseline ADC 102 according to the capacitor assignment of the respective baseline ADC 102. For example, in baseline ADC 102-1 having a capacitor assignment of C1-C4 from left to right, connections of the capacitor C1 are controlled using the switch S1 while in baseline ADC 102-2 having a capacitor assignment of C4-C1 from left to right, connections of the capacitor C1 are controlled using the switch S4. The switching module 304 of each baseline ADC 102 can be programmed to control the switches of the respective baseline ADC 102 according to the capacitor assignment of the respective baseline ADC 102. In some implementations, a single switching module may be used to control the switches of the baseline ADC's 102 according to the capacitor assignments of the baseline ADC's 102.

Figure 9:
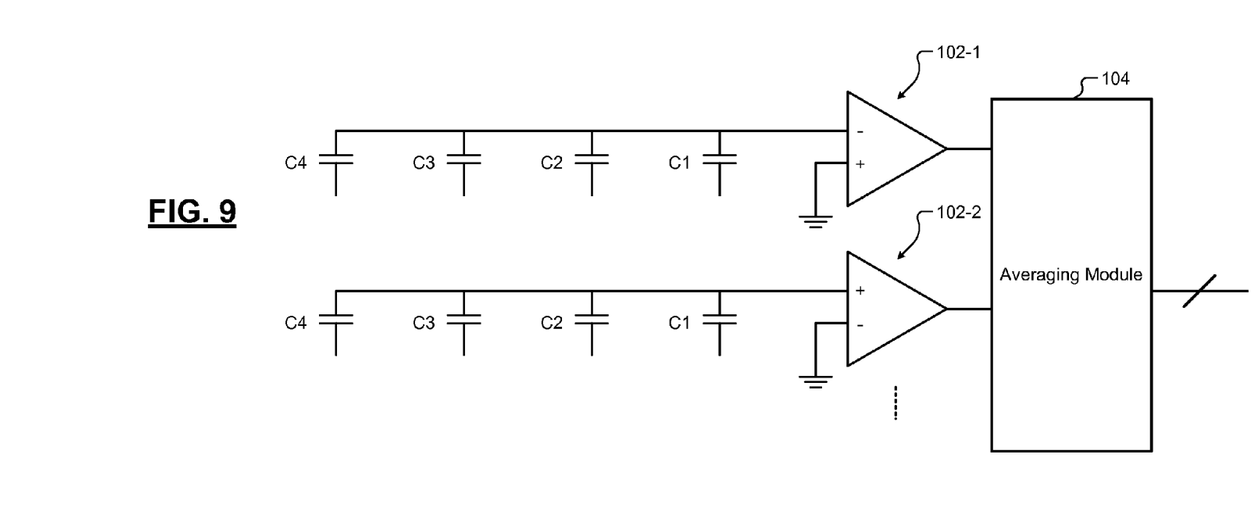
FIG. 9 is a schematic of an ADC including a plurality of baseline ADC's, where capacitors are connected to inverting comparator inputs in one half of the baseline ADC's and to non-inverting comparator inputs in other half of the baseline ADC's.

Referring now to FIG. 9, errors due to systematic offsets of comparators in the baseline ADC's 102 can be minimized by using the non-inverting input of the comparator 302 in a first half of the baseline ADC's 102 and using the inverting input of the comparator 302 in a second half of the baseline ADC's 102. For example, in a first baseline ADC 102-1, the capacitors may be connected to the inverting input of the comparator while the non-inverting input of the comparator is connected to ground; and in a second baseline ADC 102-2, the capacitors may be connected to the non-inverting input of the comparator while the inverting input of the comparator is connected to ground; and so on.

Figure 10:
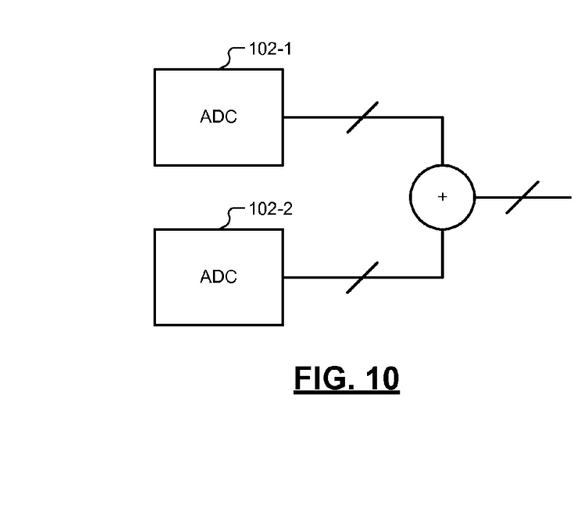
FIG. 10 is a functional block diagram of an ADC including two baseline ADC's connected in parallel to an adder.

Referring now to FIG. 10, the resolution of an ADC comprising multiple baseline ADC's can be increased by one bit by doubling the number of baseline ADC's. For example, when two 10-bit baseline ADC's are connected in parallel and their outputs are summed as shown, the resulting ADC is an 11-bit ADC. The additional bit (i.e., the eleventh bit) is available in the same time in which each of the two baseline ADC's generate their respective 10 bits. That is, the additional bit is available without spending any additional time to generate it. Each additional bit increases the precision of the resulting ADC by a half of a bit. Accordingly, when two 10-bit baseline ADC's are connected in parallel and their outputs are summed, the precision of the resulting ADC increases by a half of a bit.

When four 10-bit baseline ADC's are connected in parallel and their outputs are summed, the resulting ADC is a 12-bit ADC. The additional two bits (i.e., the eleventh and twelfth bits) are available in the same time in which each of the four baseline ADC's generate their respective 10 bits. The additional two bits are available without spending any time to generate them. The precision of the resulting ADC increases by a bit. When 256 10-bit baseline ADC's are connected in parallel and their outputs are summed, the resulting ADC is an 18-bit ADC, where the additional 8 bits are available without spending any time to generate them. The precision of the resulting ADC increases by four bits, and so on.

Figure 11:
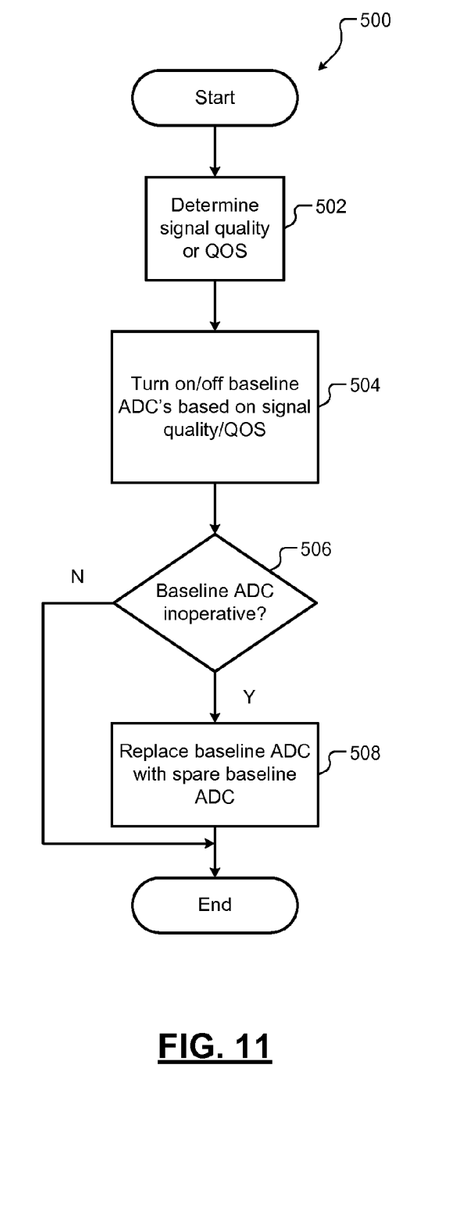
FIG. 11 is a flowchart of a method for operating an ADC comprising a plurality of baseline ADC's connected in parallel.

Referring now to FIG. 11, a method 500 for operating an ADC comprising a plurality of baseline ADC's connected in parallel is shown. At 502, control determines signal quality (e.g., signal strength or SNR) of the received signal or quality of service (QOS) requirement of the system employing the plurality of baseline ADC's. At 504, control turns off one or more baseline ADC's if the signal quality (e.g., signal strength or SNR) of the received signal is greater than or equal to a predetermined threshold. Control turns on one or more baseline ADC's, which were previously turned off, if the signal quality (e.g., signal strength or SNR) of the received signal is less than or equal to a predetermined threshold. Control turns off one or more baseline ADC's if the QOS requirement is less than or equal to a predetermined threshold. Control turns on one or more baseline ADC's, which were previously turned off, if the QOS requirement is greater than or equal to a predetermined threshold. At 506, control determines if a baseline ADC is inoperative (e.g., defective or in metastable state). At 508, control disconnects the inoperative baseline ADC and connects a spare baseline ADC instead.

Figure 12:
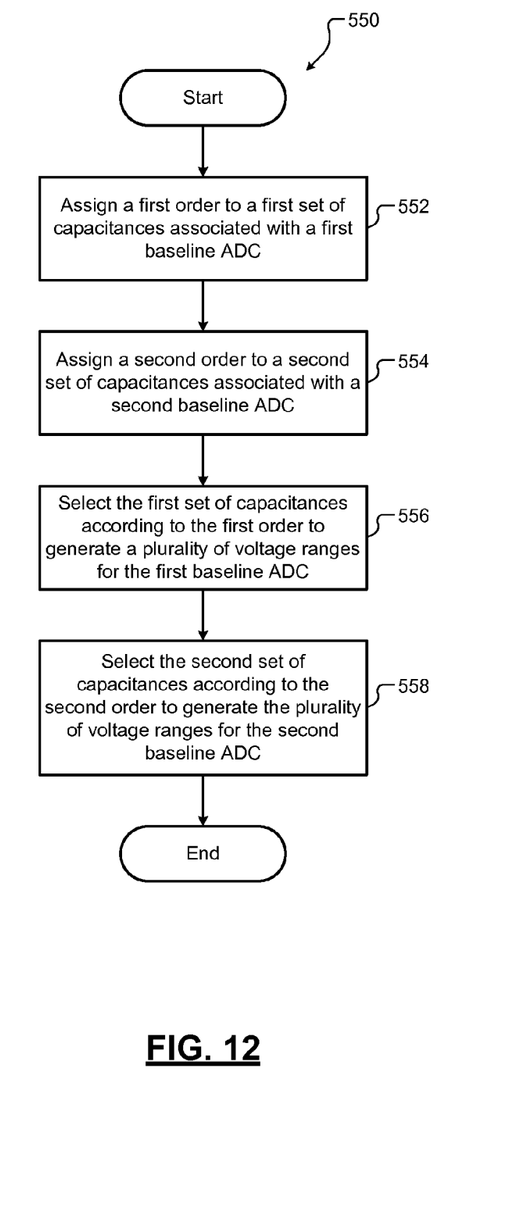
FIG. 12 is a flowchart of a method for reducing random and systematic errors in an ADC comprising a plurality of baseline ADC's connected in parallel.

Referring now to FIG. 12, a method 550 for reducing random and systematic errors in an ADC comprising a plurality of baseline ADC's connected in parallel is shown. At 552, control assigns a first order to a first set of capacitances associated with a first baseline ADC. At 554, control assigns a second order to a second set of capacitances associated with a second baseline ADC. The second order is different than the first order. At 556, control selects the first set of capacitances according to the first order to generate a plurality of voltage ranges for the first baseline ADC. At 558, control selects the second set of capacitances according to the second order to generate the plurality of voltage ranges for the second baseline ADC.

Figure 13:
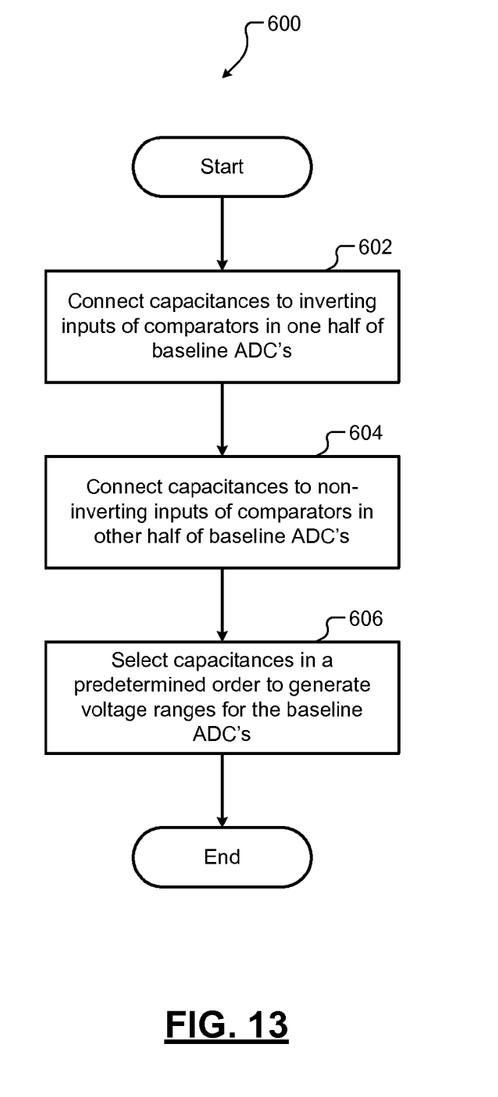
FIG. 13 is a flowchart of a method for reducing systematic errors due to comparator offsets in an ADC comprising a plurality of baseline ADC's connected in parallel.

Referring now to FIG. 13, a method 600 for reducing systematic errors due to comparator offsets in an ADC comprising a plurality of baseline ADC's connected in parallel is shown. At 602, control connects capacitances to inverting inputs of comparators while connecting non-inverting inputs of the comparators to ground (or a reference potential) in one half of baseline ADC's. At 604, control connects capacitances to non-inverting inputs of comparators while connecting inverting inputs of the comparators to ground (or a reference potential) in other half of baseline ADC's. At 606, control selects the capacitances in a predetermined order to generate voltage ranges for the baseline ADC's.

For example, control may select capacitances connected inverting inputs in the same order as the capacitances connected to non-inverting inputs. Control may also select capacitances connected inverting inputs in a different order than the capacitances connected to non-inverting inputs. Further, control may select capacitances connected to inverting inputs of one baseline ADC in a different order than the capacitances connected to inverting inputs of another baseline ADC. Additionally, control may select capacitances connected to non-inverting inputs of one baseline ADC in a different order than the capacitances connected to non-inverting inputs of another baseline ADC.

Figure 14:
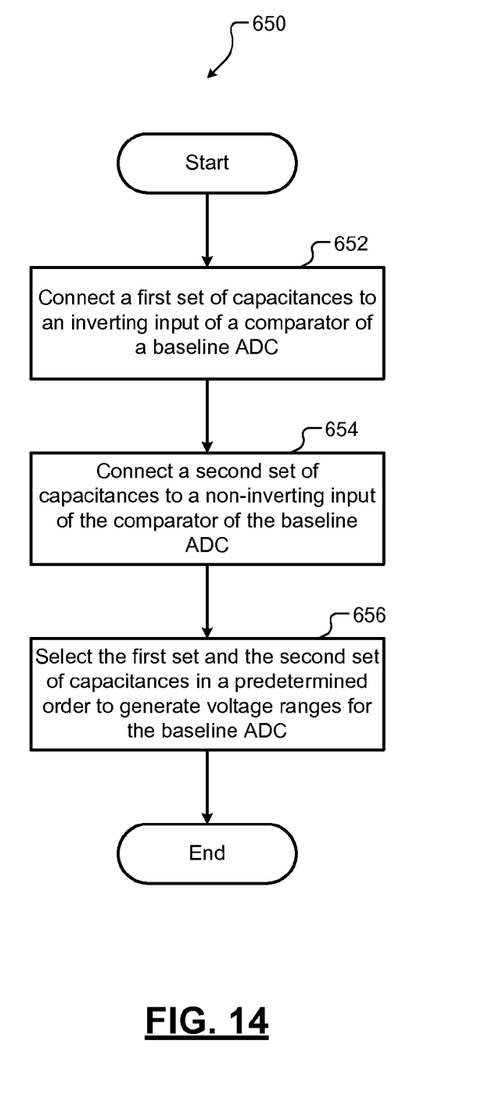
FIG. 14 is a flowchart of a method for reducing random and systematic errors in an ADC comprising a plurality of differential baseline ADC's connected in parallel.

Referring now to FIG. 14, a method 650 for reducing random and systematic errors in an ADC comprising a plurality of differential baseline ADC's connected in parallel is shown. At 652, control connects a first set of capacitances to an inverting input of a comparator of a baseline ADC. At 654, control connects a second set of capacitances to a non-inverting input of the comparator of the baseline ADC. At 656, control selects the first set and the second set of capacitances in a predetermined order to generate voltage ranges for the baseline ADC.

For example, control may assign a first order to the first set of capacitances and a second order to the second set of capacitances. The second order is different than the first order. Control may select the first set of capacitances according to the first order and the second set of capacitances according to the second order to generate the voltage ranges for the baseline ADC.

In summary, one benefit of parallelizing baseline SAR ADC is the ability to remove systematic device mismatch. For example, if a capacitor array is used, a given capacitor location in a different ADC could be assigned for different ADC segments. For example, the unit capacitor nearest to the capacitor array boundary is likely to have the largest capacitor variation (despite having dummy capacitors). If, for different baseline SAR ADC, these mismatched capacitors are assigned to different segments, the net effect is that the effects of mismatched capacitors are attenuated when averaged with the effects of matched capacitors. In differential baseline ADC's, for a single baseline SAR ADC, the boundary capacitors can be assigned differently for the positive and negative half of the capacitor arrays. For that matter, the positive and negative half capacitor assignment could be completely different to compensate for linear gradient as well as boundary mismatch. Having more baseline ADCs in parallel presents many more possibilities in term of rearranging the capacitor assignment.

The number of bits effectively double for every doubling the number of baseline ADC's. However, the noise improves only by a factor of two (6 dB) for every quadrupling. For applications that do not need high individual SNR but need high long-term SNR, parallelizing baseline ADC's could be beneficial without the expense of generating more bits than needed in the short term. An example application would be for video digitizer, where each individual pixel SNR could be lower than the overall SNR of group of adjacent pixels. In other words, parallelizing baseline ADC's could be used to generate higher dynamic range than SNR range.

A baseline medium-resolution capacitive SAR ADC can be designed using cylindrical unit capacitors. The baseline ADC's are replicated to build a higher resolution/precision ADC. The inputs to the baseline ADC's are connected together and to the same input signal. The ADC sampling clock of the baseline ADC's is also tied together so that every baseline ADC samples the same input signal at the same time. Alternative sampling on different phases is a variant that can be used to add oversampling capability to these parallel-connected baseline ADC's. The output of the baseline ADC's is averaged out to reduce (or even eliminate) individual ADC non linearity, noise, offset, and other non-idealities.

At least a 10-bit baseline ADC can be used as a starting point since a 10-bit baseline ADC can be easily built without using a large silicon area. For example, a 10-bit baseline ADC can be easily built using a silicon area of about the size of a pad opening. An 11-bit base line ADC with the capacitor sized for 1-bit kT/C noise could be the ideal choice.

Four baseline ADC's could be replicated to build say a 12-bit ADC for a 10 Gb Ethernet or PLC product. If an 11-bit baseline ADC with 10-bit noise is used, the result after averaging will be a 12-bit ADC with 11-bit noise. If this is not sufficient in terms of SNR, eight of the baseline ADC's can be used. After averaging, the noise will be approximately 11.5 bits.

There are various benefits of using the replication/averaging approach described in the present disclosure. For example, one needs to design only one baseline ADC for a large range of applications. This ultimately saves time and effort. For example, for a Gigabit Ethernet (GE) PHY, one needs only one baseline ADC while for a 10 Gigabit (10G) PHY, one may need four interleaved channels of four baseline SAR ADC's to get SNR as well as quad speed boost.

One can decide how many baseline ADC's to replicate based on SNR requirement, which may change dynamically. One can dynamically turn off a number of baseline ADC's to save power when the input signal has a high SNR. For example, in 10G Ethernet, when the connection is over a short distance, one can easily use just one baseline ADC and turn off the other three (if four baseline ADC's are used) or seven (if eight baseline ADC's are used) baseline ADC's to save power. As another example, for cellphone transceiver or TV tuner, one could use only one baseline ADC when the cellphone transceiver or TV tuner is close to the base station. The power saving could be substantial because often the SNR in real life is better than the worst-case scenario. Traditional types of ADC's cannot achieve this type of power saving because the size and therefore the power of the ADC are effectively fixed during design.

Further, the cost of incorporating redundancy to ADC design according to the present disclosure is not significant since each baseline ADC is very small in size. A defective baseline ADC could simply be taken out from service and replaced with a spare baseline ADC.

In addition, one can cancel out process gradient and any other systematic mismatch and offset by making each baseline ADC slightly different in terms of the capacitor arrangements in such a way that for the same type of errors the contribution of that error affects different transition points in different baseline ADC. For example, the unit capacitors that are closest to the edge of the capacitor array will be assigned to different segments in different base line ADC. Also the layout of every other baseline ADC could be mirrored so that any mirror-type systematic offset is exactly cancelled out after averaging. The net effect is that fewer dummies are required in the layout and yet better overall matching can be achieved after averaging.

Further, power supply noise will be lower since each baseline ADC would not switch at the same time during the ADC conversion process due to the use of asynchronous self-time clocking in each baseline ADC.

If the number of baseline ADC's is sufficient, one can ignore the baseline ADC that gets into a metastable state. Once in a while, one could gain conversion speed at the expense of slightly worse SNR when one of the baseline ADC goes into a metastable state (e.g., when a baseline ADC does not finish a conversion process).

Replicating baseline ADC results in more uniform metal, poly, via, and various other material/mask density. Furthermore chemical mechanical polishing/planarization (CMP) and etching results will be more uniform. Thus the matching of capacitors will be better, which ultimately results in better overall ADC precision.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be partially or fully implemented by one or more computer programs executed by one or more processors. The computer programs include processor-executable instructions that are stored on at least one non-transitory tangible computer readable medium. The computer programs may also include and/or rely on stored data. Non-limiting examples of the non-transitory tangible computer readable medium include nonvolatile memory, volatile memory, magnetic storage, and optical storage.

What is claimed is:

1. A system comprising:
   a clock generator configured to generate a clock;
   a plurality of analog-to-digital converters, wherein each analog-to-digital converter of the plurality of analog-to-digital converters is respectively configured to
     convert a signal based on the clock, and
     output a first number of bits in response to converting the signal based on the clock;
   an averaging module configured to
     receive the first number of bits respectively output from each analog-to-digital converter of the plurality of analog-to-digital converters, and
     output a second number of bits,
     wherein the second number of bits is greater than the first number of bits;
   an additional analog-to-digital converter configured to convert the signal based on the clock;
   a detection module configured to detect when one of the plurality of analog-to-digital converters is defective; and
   a disconnection module configured to (i) disconnect the defective one of the plurality of analog-to-digital converters from the averaging module and (ii) connect the additional analog-to-digital converter to the averaging module in response to disconnecting the defective one of the plurality of analog-to-digital converters from the averaging module,
   wherein a first analog-to-digital converter of the plurality of analog-to-digital converters is configured to convert the signal based on a plurality of voltage ranges generated using a first set of capacitances in a first order,
   wherein a second analog-to-digital converter of the plurality of analog-to-digital converters is configured to convert the signal based on the plurality voltage ranges generated using a second set of capacitances in a second order,
   wherein the first set of capacitances and the second set of capacitances have a predetermined capacitance and are arranged in a predetermined order, and
   wherein the first order is different than the second order.

2. The system of claim 1, wherein the second number of bits is a function of (i) the first number of bits and (ii) a number of analog-to-digital converters in the plurality of analog-to-digital converters.

3. The system of claim 1, wherein:
   the second number of bits is a sum of (i) the first number of bits and (ii) one-half of a logarithm of a number of analog-to-digital converters in the plurality of analog-to-digital converters, and
   a base of the logarithm is 2.

4. The system of claim 1, further comprising:
a signal quality determination module configured to determine quality of the signal, wherein the quality of the signal includes one or more of (i) strength of the signal and (ii) signal-to-noise ratio of the signal; and
a power management module configured to
select, based on the quality of the signal, a number of analog-to-digital converters from the plurality of analog-to-digital converters, and
deactivate the selected number of analog-to-digital converters.

5. The system of claim 1, further comprising:
a quality of service determination module configured to determine a quality of service requirement of the system; and
a power management module configured to
select, based on the quality of service requirement of the system, a number of analog-to-digital converters from the plurality of analog-to-digital converters, and
deactivate the selected number of analog-to-digital converters.

6. A system comprising:
a clock generator configured to generate a clock;
a plurality of analog-to-digital converters, wherein each analog-to-digital converter of the plurality of analog-to-digital converters is respectively configured to
convert a signal based on the clock, and
output a first number of bits in response to converting the signal based on the clock;
an averaging module configured to
receive the first number of bits respectively output from each analog-to-digital converter of the plurality of analog-to-digital converters, and
output a second number of bits,
wherein the second number of bits is greater than the first number of bits;
an additional analog-to-digital converter configured to convert the signal based on the clock;
a detection module configured to detect when one of the plurality of analog-to-digital converters is defective; and
a disconnection module configured to (i) disconnect the defective one of the plurality of analog-to-digital converters from the averaging module and (ii) connect the additional analog-to-digital converter to the averaging module in response to disconnecting the defective one of the plurality of analog-to-digital converters from the averaging module,
wherein one of the plurality of analog-to-digital converters includes
a comparator having an inverting input and a non-inverting input;
a first set of capacitances connected to the inverting input; and
a second set of capacitances connected to the non-inverting input,
wherein the first set of capacitances and the second set of capacitances have a predetermined capacitance and are arranged in a predetermined order,
wherein the one of the plurality of analog-to-digital converters is configured to convert the signal based on a plurality voltage ranges generated using the first set of capacitances in a first order and the second set of capacitances in a second order, and
wherein the first order is different than the second order.

7. The system of claim 6, wherein the second number of bits is:
a function of (i) the first number of bits and (ii) a number of analog-to-digital converters in the plurality of analog-to-digital converters; or
a sum of (i) the first number of bits and (ii) one-half of a logarithm of a number of analog-to-digital converters in the plurality of analog-to-digital converters, wherein a base of the logarithm is 2.

8. The system of claim 6, further comprising:
a signal quality determination module configured to determine quality of the signal, wherein the quality of the signal includes one or more of (i) strength of the signal and (ii) signal-to-noise ratio of the signal; and
a power management module configured to
select, based on the quality of the signal, a number of analog-to-digital converters from the plurality of analog-to-digital converters, and
deactivate the selected number of analog-to-digital converters.

9. The system of claim 6, further comprising:
a quality of service determination module configured to determine a quality of service requirement of the system; and
a power management module configured to
select, based on the quality of service requirement of the system, a number of analog-to-digital converters from the plurality of analog-to-digital converters, and
deactivate the selected number of analog-to-digital converters.

10. A system comprising:
a clock generator configured to generate a clock;
a plurality of analog-to-digital converters, wherein each analog-to-digital converter of the plurality of analog-to-digital converters is respectively configured to
convert a signal based on the clock, and
output a first number of bits in response to converting the signal based on the clock;
an averaging module configured to
receive the first number of bits respectively output from each analog-to-digital converter of the plurality of analog-to-digital converters, and
output a second number of bits,
wherein the second number of bits is greater than the first number of bits;
an additional analog-to-digital converter configured to convert the signal based on the clock;
a detection module configured to detect when one of the plurality of analog-to-digital converters is defective; and
a disconnection module configured to (i) disconnect the defective one of the plurality of analog-to-digital converters from the averaging module and (ii) connect the additional analog-to-digital converter to the averaging module in response to disconnecting the defective one of the plurality of analog-to-digital converters from the averaging module,
wherein a first analog-to-digital converter of the plurality of analog-to-digital converters includes (i) a first comparator and (ii) a first set of capacitances connected to an inverting input of the first comparator and is configured to convert the signal based on a plurality of voltage ranges generated using the first set of capacitances in a first order,
wherein a second analog-to-digital converter of the plurality of analog-to-digital converters includes (i) a second comparator and (ii) a second set of capacitances connected to a non-inverting input of the second comparator and is configured to convert the signal based on the plurality of voltage ranges generated using the second set of capacitances in a second order, wherein the first set of capacitances and the second set of capacitances have a predetermined capacitance and are arranged in a predetermined order, and wherein the first order is different than the second order.

11. The system of claim 10, wherein the second number of bits is:

a function of (i) the first number of bits and (ii) a number of analog-to-digital converters in the plurality of analog-to-digital converters; or a sum of (i) the first number of bits and (ii) one-half of a logarithm of a number of analog-to-digital converters in the plurality of analog-to-digital converters, wherein a base of the logarithm is 2.

12. The system of claim 10, further comprising:

a signal quality determination module configured to determine quality of the signal, wherein the quality of the signal includes one or more of (i) strength of the signal and (ii) signal-to-noise ratio of the signal; and a power management module configured to select, based on the quality of the signal, a number of analog-to-digital converters from the plurality of analog-to-digital converters, and deactivate the selected number of analog-to-digital converters.

13. The system of claim 10, further comprising:

a quality of service determination module configured to determine a quality of service requirement of the system; and a power management module configured to select, based on the quality of service requirement of the system, a number of analog-to-digital converters from the plurality of analog-to-digital converters, and deactivate the selected number of analog-to-digital converters.

14. A method comprising:

based on a clock, converting a signal using a plurality of analog-to-digital converters;

in response to converting the signal based on the clock, respectively outputting a first number of bits from each analog-to-digital converter of the plurality of analog-to-digital converters;

based on the first number of bits respectively output from each of the plurality of analog-to-digital converters, outputting a second number of bits, wherein the second number of bits is greater than the first number of bits;

in response to detecting when one of the plurality of analog-to-digital converters is defective (i) disconnecting the defective one of the plurality of analog-to-digital converters;

(ii) connecting an additional analog-to-digital converter in response to disconnecting the defective one of the plurality of analog-to-digital converters; and (iii) converting the signal using the additional analog-to-digital converter based on the clock;

wherein converting the signal using a plurality of analog-to-digital converters further comprises (i) converting the signal, using a first analog-to-digital converter of the plurality of analog-to-digital converters, based on a plurality of voltage ranges generated using a first set of capacitances in a first order; and (ii) converting the signal, using a second analog-to-digital converter of the plurality of analog-to-digital converters, based on the plurality voltage ranges generated using a second set of capacitances in a second order, wherein the first set of capacitances and the second set of capacitances have a predetermined capacitance and are arranged in a predetermined order, and wherein the first order is different than the second order.

15. The method of claim 14, wherein the second number of bits is a function of (i) the first number of bits and (ii) a number of analog-to-digital converters in the plurality of analog-to-digital converters.

16. The method of claim 14, wherein:

the second number of bits is a sum of (i) the first number of bits and (ii) one-half of a logarithm of a number of analog-to-digital converters in the plurality of analog-to-digital converters, and a base of the logarithm is 2.

17. The method of claim 14, further comprising:

determining quality of the signal, wherein the quality of the signal includes one or more of (i) strength of the signal and (ii) signal-to-noise ratio of the signal;

selecting, based on the quality of the signal, a number of analog-to-digital converters from the plurality of analog-to-digital converters; and deactivating the selected number of analog-to-digital converters.

18. The method of claim 14, further comprising:

determining a quality of service requirement of a system;

selecting, based on the quality of service requirement of the system, a number of analog-to-digital converters from the plurality of analog-to-digital converters; and deactivating the selected number of analog-to-digital converters.

\* \* \* \* \*